(12) United States Patent
Makino et al.

(10) Patent No.: US 7,382,184 B2
(45) Date of Patent: Jun. 3, 2008

(54) AMPLIFIER SYSTEM AND METHOD

(75) Inventors: Jun Makino, Singapore (SG); Boon Ghee Ting, Singapore (SG)

(73) Assignee: Creative Technology Ltd, Singapore (SG)

( * ) Notice: Subject to any disclaimer, the term of this patent is extended or adjusted under 35 U.S.C. 154(b) by 162 days.

(21) Appl. No.: 10/971,785

(22) Filed: Oct. 22, 2004

(65) Prior Publication Data

US 2006/0087369 A1    Apr. 27, 2006

(51) Int. Cl.
*H03F 3/45* (2006.01)

(52) U.S. Cl. ...................................... 330/69
(58) Field of Classification Search .............. 330/69, 330/4, 206
See application file for complete search history.

(56) References Cited

U.S. PATENT DOCUMENTS

| | | | |
|---|---|---|---|
| 3,319,175 A | 5/1967 | Dryden | |
| 3,585,517 A | 6/1971 | Herbert | |
| 4,054,843 A | 10/1977 | Hamada | |
| 4,206,416 A * | 6/1980 | Kellogg | 330/69 |
| 4,628,278 A | 12/1986 | Bottman | |
| 5,475,342 A * | 12/1995 | Nakamura et al. | 330/136 |
| 6,057,731 A | 5/2000 | Gorcea | |
| 6,373,340 B1 | 4/2002 | Shashoua | |
| 6,396,933 B1 | 5/2002 | Jung | |
| 6,496,059 B1 | 12/2002 | Nguyen | |
| 6,507,223 B2 * | 1/2003 | Felder | 327/77 |
| 6,812,787 B2 * | 11/2004 | Kimura | 330/69 |
| 2002/0097080 A1 | 7/2002 | Smadegaard-Pedersen | |
| 2003/0184373 A1 | 10/2003 | Cameron | |

* cited by examiner

*Primary Examiner*—Robert J. Pascal
*Assistant Examiner*—Alan Wong
(74) *Attorney, Agent, or Firm*—Russell N. Swerdon

(57) ABSTRACT

An amplifier system comprises a first amplifier arranged to receive an input signal and a second amplifier arranged to receive a proportion of the input signal. A first potential divider is arranged to receive the output signal of the second amplifier and to feed a proportion of the output signal to the first amplifier. The first amplifier is arranged to subtract the proportion of the output signal of the second amplifier from the input signal to produce a difference signal for amplification by the first amplifier. There is also disclosed a method of amplifying a signal.

28 Claims, 6 Drawing Sheets

AMPLIFIER SYSTEM AND METHOD

FIELD OF THE INVENTION

The present invention relates generally to an amplifier system and method and more particularly to such a system and method suitable for use in the field of high fidelity audio amplifiers.

BACKGROUND OF THE INVENTION

High quality sound systems require amplifiers which produce good sound quality. Sound quality is not something that may easily be measured and an amplifier which may have good physical characteristics such as a wide frequency response at both low and high frequencies, low phase shift and low distortion, may not necessarily produce good quality sound. The reason for this appears to be due to errors or distortions which are not obvious from studying the amplifier's physical characteristics. These distortions may be reduced by applying overall negative feedback.

For audio applications, it is believed that amplifiers without feedback may have desirable characteristics that are good for sound. However, amplifiers without feedback usually do not have good measurement characteristics, such as total harmonic distortion (THD) measurements, when compared to amplifiers that utilise feedback.

There is therefore a need for amplifiers which have improved measurement characteristics and therefore improved performance, irrespective of whether or not feedback is applied.

SUMMARY OF THE INVENTION

In general terms, the invention provides an amplifier system and method in which errors in two or more amplifiers in the system are cancelled by subtraction.

According to a first aspect of the invention there is provided an amplifier system comprising:
  a first amplifier arranged to receive an input signal;
  a second amplifier arranged to receive a proportion of said input signal, said second amplifier having an output signal; and
  a first potential divider arranged to receive said output signal of said second amplifier and to feed a proportion of said output signal to said first amplifier;
  wherein said first amplifier is arranged to subtract said proportion of said output signal of said second amplifier from said input signal to produce a difference signal amplifiable by said first amplifier.

According to a second aspect there is provided an audio amplifier system comprising the amplifier system defined above.

According to a third aspect of the invention there is provided a method of amplifying a signal comprising:
  applying an input signal to a first amplifier;
  applying a proportion of said input signal to a second amplifier, said second amplifier having an output signal;
  applying to a first potential divider said output signal of said second amplifier;
  applying a proportion of said output signal to said first amplifier; and
  subtracting in said first amplifier said proportion of said output signal of said second amplifier from said input signal to produce a difference signal amplifiable by said first amplifier.

BRIEF DESCRIPTION OF THE DRAWINGS

Preferred features of the invention will now be described, for the sake of illustration only, with reference to the following Figures in which.

DESCRIPTION OF PREFERRED EMBODIMENTS

Figure 1:
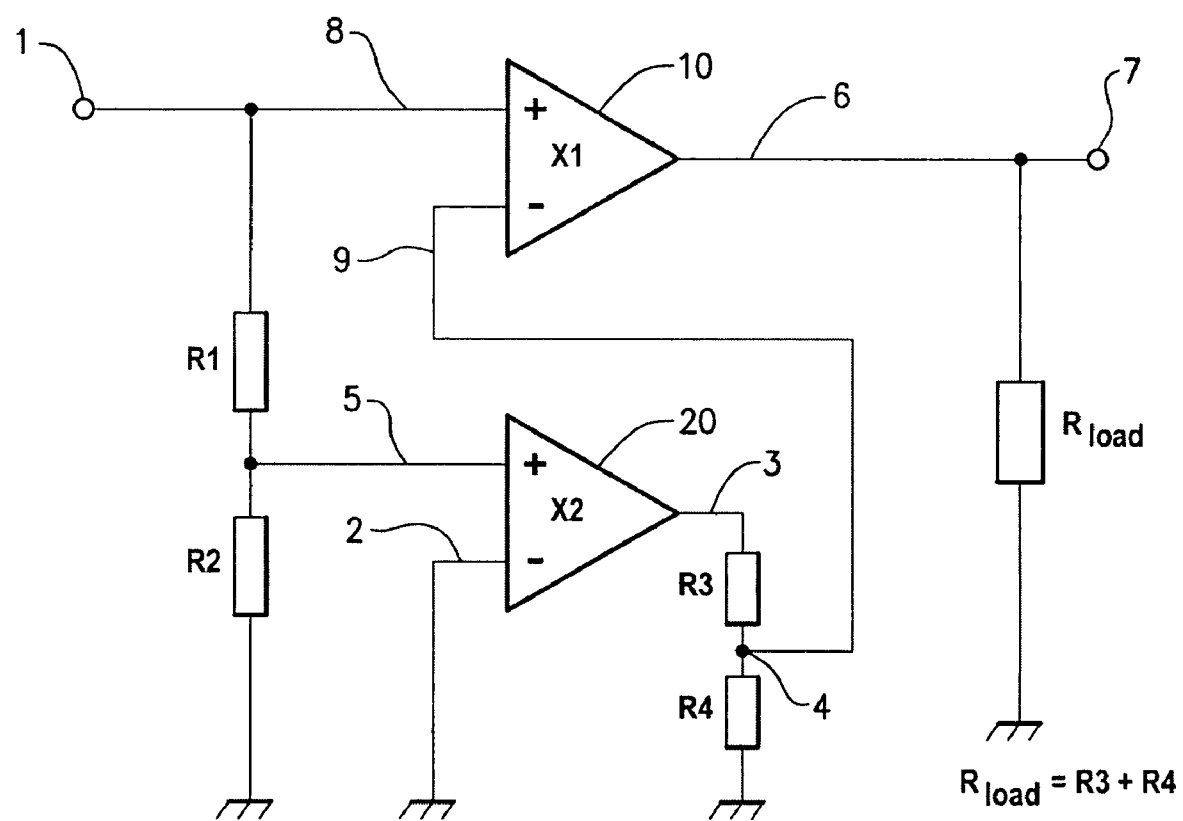
FIG. 1 is a schematic circuit diagram of an amplifier circuit according to one embodiment of the invention.

FIG. 1 shows an amplifier circuit according to one embodiment of the invention. The circuit comprises two identical amplifiers, a main amplifier (X1) 10 and a second amplifier (X2) 20. Both amplifiers have twice the gain $G_V$ required of the overall system. As the amplifiers are identical, they will have similar errors E generated during the amplification process. Ideally, the same operating conditions, such as the same supply voltage, same input voltage and same load impedance are applied to both amplifiers 10 and 20.

In the system of FIG. 1, the incoming signal $V_{in}$ is applied to a first point (point 1) and is then applied to the positive input of the main amplifier 10. The incoming signal is also applied to a first end of a first resistor R1, the other end of the first resistor R1 being connected to a first end of a second resistor R2. The other end of the second resistor R2 is connected to the system ground. The junction of the first and second resistors R1 and R2 which form a potential divider is connected to the positive input of the second amplifier 20. The negative input of the second amplifier 20 is connected, at a point 2, to the system ground.

The output of the second amplifier 20 is connected, at a point 3, to the first end of a third resistor R3, the other end of the third resistor R3 being connected to a first end of a fourth resistor R4. The second end of the fourth resistor R4 is connected to system ground.

The junction of the third and fourth resistors R3 and R4, which is termed point 4, is connected to the negative input 9 of the main amplifier 10. The output of the main amplifier 10 is connected to one end of a load, which may be, for example, another amplifier such as a power amplifier in which case the load is a resistive element to ground, or another element such as a loud speaker. The other end of the load is connected to the system ground. The voltage across the load constitutes the output of the amplifier circuit.

The first and second resistors R1 and R2 are preferably identical and the signal at a point 5, which is the positive input of the second amplifier 20, will be half the input signal at point 1. Thus, if R1=R2 then $$V5 = \tfrac{1}{2}V1 = \tfrac{1}{2}V_{in} \tag{1}$$

The voltage at point 3, which is the output of the second amplifier 20, is given by:

$$V3 = 2 \times G_V(V5 - V2) + E \quad \text{where } E \text{ is the error generated by } X2 \tag{2}$$

$$= 2 \times G_V\left(\tfrac{1}{2}V_{in} - 0\right) + E \quad \text{Substitute } eq\ (1)$$

$$= 2 \times G_V\left(\tfrac{1}{2}V_{in}\right) + E$$

$$= G_v \times V_{in} + E$$

$$V3 = G_V V_{in} + E$$

The third and fourth resistors R3 and R4 are preferably high precision resistors and the values are related as follows:

$$\frac{R4}{R3 + R4} = \frac{1}{2 \times G_V} \tag{3}$$

Further, if R3+R4=Rload, so that both amplifiers 10 and 20 are equally loaded, this is the optimal condition but is not essential for the invention to work. Ideally, this load condition should be implemented for optimal results. However, the present invention will still work even if there is deviation from this load condition.

The voltage at the output of the potential divider formed by the third and fourth resistors R3 and R4, is given by:

$$V4 = \frac{R4}{R3 + R4} \times V3 \tag{4}$$

$$= \frac{1}{2 \times G_V} \times (G_V V_{in} + E) \quad \text{Substitute } eq\ (2) \text{ and } eq\ (3)$$

$$V4 = \frac{V_{in}}{2} + \frac{E}{2G_V}$$

This voltage V4 is applied to the negative input of the main amplifier 10 at a point 9 and the voltage at point 9 may be denoted as follows:

$$V9 = \frac{V_{in}}{2} + \frac{E}{2G_V} \tag{5}$$

One embodiment of an amplifier system includes a first amplifier arranged to receive an input signal and a second amplifier arranged to receive a second signal having a voltage level that is a proportion of the input signal, the second amplifier having an output signal. A first potential divider is arranged to receive the output signal of the second amplifier and to feed a proportion of the output signal to the first amplifier. The first potential divider comprises a first resistive component and a second resistive component, each of the first and second resistive components having an associated resistance, the ratio of the resistance associated with the first resistive component to the resistance associated with the second resistive component being such that the amplitude of the signal at a junction of the first and second resistive components is substantially equal to the amplitude of the input signal to the second amplifier divided by the gain of the second amplifier.

The positive input of the main amplifier 10 at point 8 is connected to the input of the system at point 1. Therefore the voltage at point 8 may be denoted by:

$$V8 = V_{in} \tag{6}$$

The voltage at the output of the main amplifier 10 at point 6 may given by:

$$V6 = 2 \times G_V(V8 - V9) + E$$

If Equations (6) and (5) are substituted in the above equation for V8 and V9 respectively, then:

$$V6 = 2 \times G_V\left[V_{in} - \left(\frac{V_{in}}{2} + \frac{E}{2G_V}\right)\right] + E \tag{7}$$

$$= 2 \times G_V\left[V_{in} - \frac{V_{in}}{2} - \frac{E}{2G_V}\right] + E$$

$$= 2 \times G_V\left[\frac{V_{in}}{2} - \frac{E}{2G_V}\right] + E$$

$$= G_V V_{in} - E + E$$

$$V6 = G_V V_{in}$$

It will be seen that the error E generated during amplification is cancelled out leaving the output of the amplifier circuit $V_{out}$ at point 7 as:

$$V_{out} = G_V V_{in}$$

An alternative presentation of the above equations is set out below. In this alternative presentation, the errors generated in the amplifier 10 and in the amplifier 20 are made distinct by naming them E1 and E2 respectively. It is also shown that, in this embodiment, R1=R2 is a condition for the output level of both amplifiers 10 and 20 to be the same and consequently for the errors from both amplifiers 10 and 20 to be the same. In general, the input to amplifier 20 should be half the magnitude of the input to amplifier 10.

The signal at a point 5, which is the positive input of the second amplifier 20

$$V_5 = \frac{R_2}{R_1 + R_2} V_{in}$$

Let A1 be the attenuation of the potential divider formed by the resistors R1 and R2, ie $$A_1 = \frac{R_2}{R_1 + R_2}.$$

Then $V_5 = A_1 V_{in}$ (1)

Let G be the gain of the individual amplifiers (not the whole system), then $$V_3 = G(V_5 - V_2) + E_2 \quad \text{Substitute eq(1)}$$

$$V_3 = A_1 G V_{in} + E_2 \quad (2)$$

where $E_2$ is error generated in second amplifier 20 and $V_2 = 0$.

The voltage at the output of the potential divider formed by the third and fourth resistors R3 and R4, may be given by:

$$V_4 = \frac{R_4}{R_3 + R_4} V_3$$

Let $A_2$ be the attenuation of the potential divider formed by the resistors R3 and R4, ie $$A_2 = \frac{R_4}{R_3 + R_4}.$$

Then $V_4 = A_2 V_3$

This voltage V4 is applied to the negative input of the main amplifier 10 at a point 9 and the voltage at point 9 may be denoted as follows:

$$V_9 = V_4 = A_2 A_1 G V_{in} + A_2 E_2 \quad (3)$$

The voltage at the output of the main amplifier 10 at point 6 may be given by:

$V_6 = G(V_8 - V_9) + E_1$, where $E_1$ is the error generated in the first amplifier 10, so $$V_6 = G(V_{in} - A_2 A_1 G V_{in} - A_2 E_2) + E_1 \quad (4)$$
$$= G(1 - A_2 A_1 G) V_{in} - A_2 G E_2 + E_1$$

For the error terms to cancel out, $$-A_2 G E_2 + E_1 = 0$$

If the errors generated in both amplifiers 10 and 20 are the same, that is, $E_1 = E_2$, then $$E_1 (1 - A_2 G) = 0$$

$$A_2 = \frac{1}{G}$$

In order to have the same errors from both amplifiers 10 and 20, that is, $E_1 = E_2$, the operating conditions of both amplifiers 10 and 20 should be the same. One consideration is that the output level from both amplifiers 10 and 20 should be the same for the operating conditions to be the same, since they have the same gain and are identical.

Thus, one way to check is to set the output of the first amplifier 10 equal to the output of the second amplifier 20. Thus, $$V_3 = V_6$$

$A_1 G V_{in} + E_2 = G(1 - A_2 A_1 G) V_{in} - A_2 G E_2 + E_1$, from Eq(2) and Eq(4)

As the magnitude of the errors are very much smaller than the amplified output signal, ignoring the error terms, $$A_1 G V_{in} = G(1 - A_2 A_1 G) V_{in}$$

As $$A_2 = \frac{1}{G},$$

Then $A_1 = 1 - A_1$ $$A_1 = \frac{1}{2}$$

This implies that for this embodiment, $R_1 = R_2$ is a necessary condition for both amplifiers to have effectively the same output level and therefore same errors. However, it should be noted that the system embodying the present invention should still work even if there is slight deviation from this condition, that is, R1 is not equal to R2. In such a condition, the error will be higher at the output. This has been verified by simulation.

Using $$A_1 = \frac{1}{2} \text{ and } A_2 = \frac{1}{G},$$

from Eq(4), $$V_6 = G(1 - A_2 A_1 G) V_{in} - A_2 G E_2 + E_1$$
$$= G\left(1 - \frac{1}{G} \frac{1}{2} G\right) V_{in} - \frac{1}{G} G E_2 + E_1$$
$$= \frac{G}{2} V_{in} - E_2 + E_1$$

If the errors are equal and cancel each other, $$V_6 = \frac{G}{2} V_{in}$$

If we let the gain of the overall system be $G_v$ (as was previously), then $$G_v = \frac{G}{2}.$$

And $V_6 = G_v V_{in}$

Thus, the output is an amplified version of the input signal with a gain of $G_v$, without error.

Figure 2A:
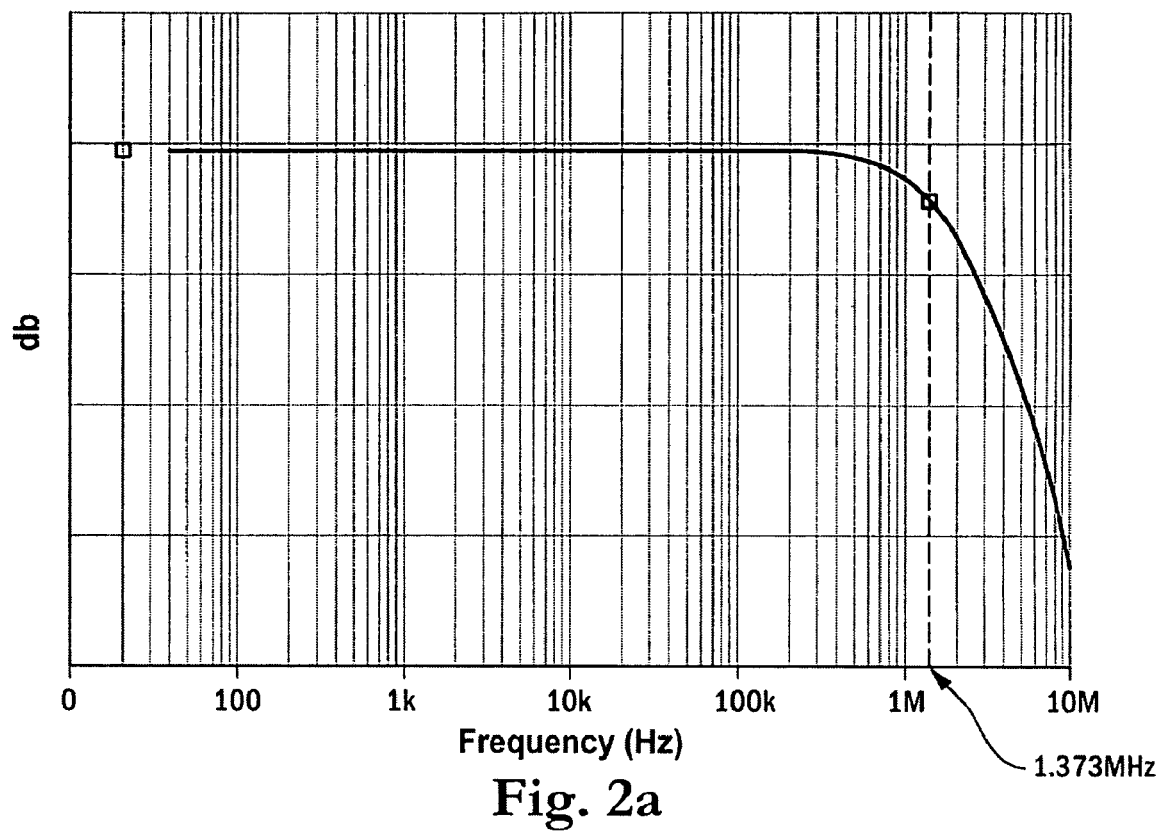
FIG. 2a is a graph showing the frequency response of an amplifier circuit taken at the output of amplifier 20 in the circuit of FIG. 1.

FIG. 2a is a graph showing the frequency response of an amplifier circuit taken at the output of amplifier 20 in the circuit of FIG. 1, which gives a bandwidth at the −3 db point of 1.373 MHz. As the amplifiers 10 and 20 are identical and operating under similar conditions, the amplifier 20 alone may be considered to be a standard amplifier not embodying the invention.

Figure 2B:
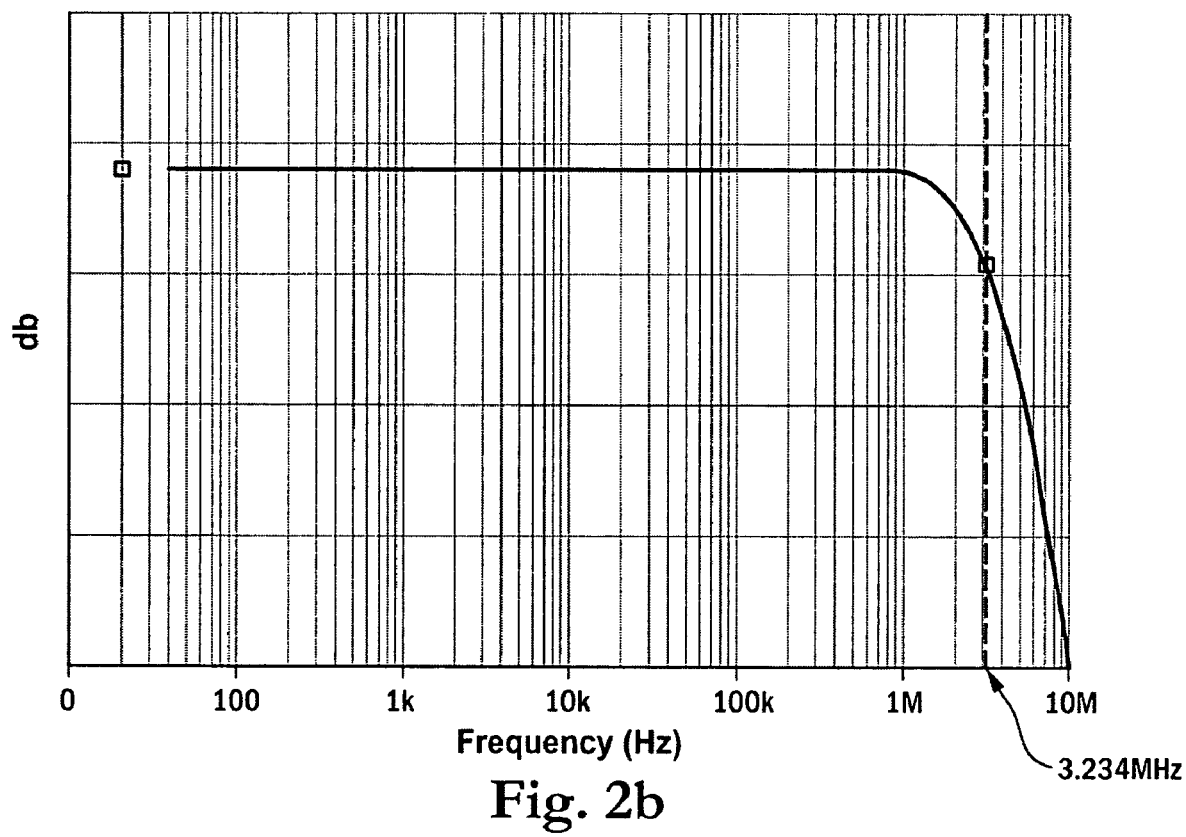
FIG. 2b is a graph showing the frequency response of an amplifier taken at the output of amplifier 10 in the circuit of FIG. 1.

FIG. 2b is a graph showing the frequency response of an amplifier taken at the output of amplifier 10 in the circuit of FIG. 1 according to one embodiment of the present invention and giving a bandwidth of 3.234 MHz at the −3 db point.

Figure 3A:
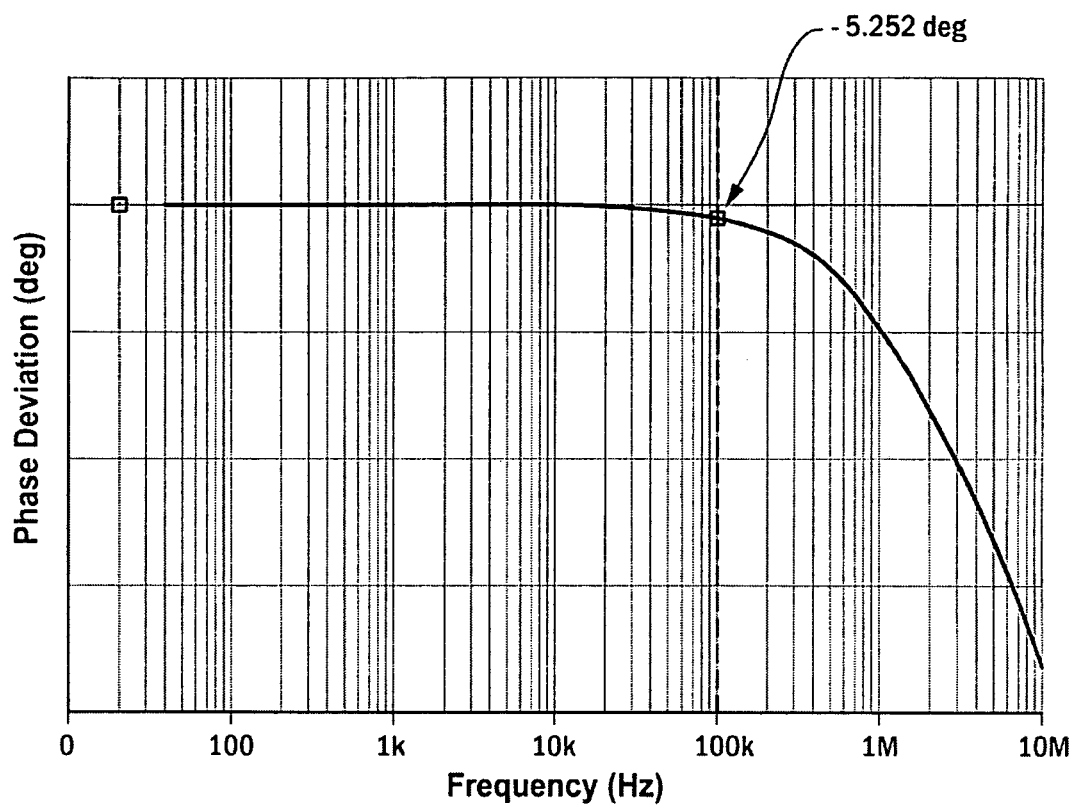
FIG. 3a is a further graph showing the phase shift of an amplifier circuit taken at the output of amplifier 20 in the circuit of FIG. 1.

FIG. 3a is a graph showing the phase shift of an amplifier circuit taken at the output of amplifier 20 in the circuit of FIG. 1. A phase deviation of −5.252 degrees at 100 kHz is shown.

Figure 3B:
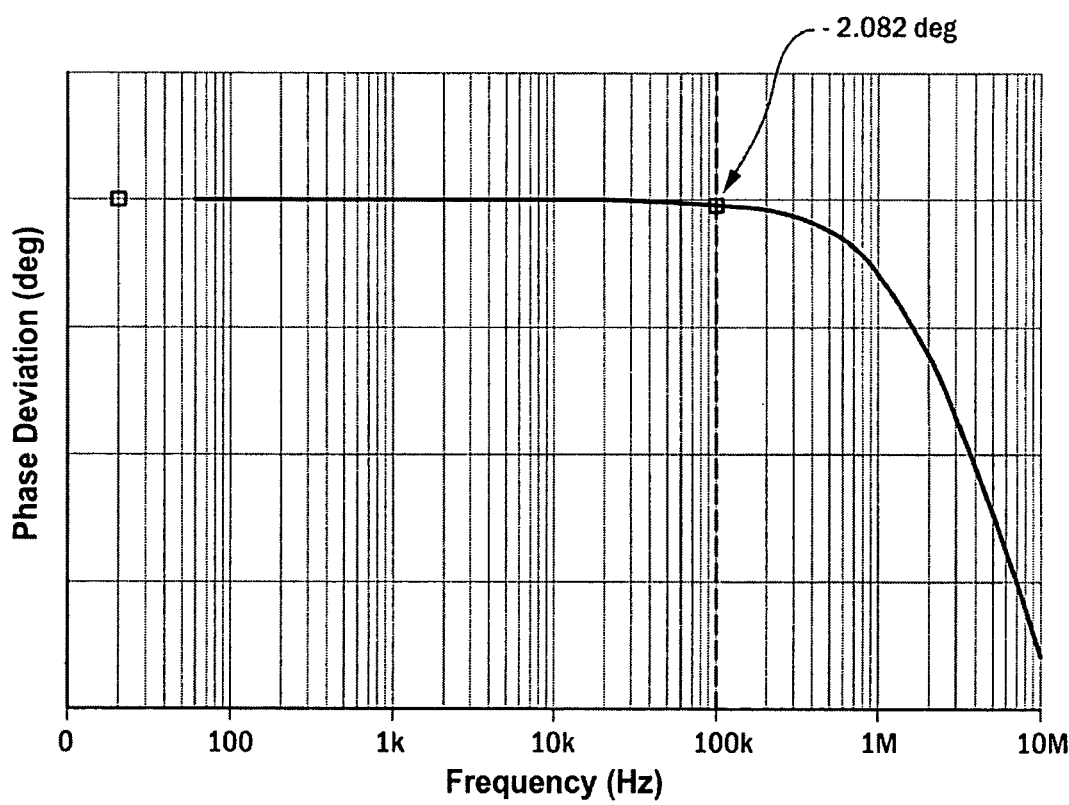
FIG. 3b is a further graph showing the phase shift of an amplifier taken at the output of amplifier 10 in the circuit of FIG. 1.

FIG. 3b is a graph showing the phase shift of an amplifier taken at the output of amplifier 10 in the circuit of FIG. 1. A phase deviation of −2.082 degrees at 100 kHz is shown.

It may be noted that 20 kHz is the typical upper limit for audio frequency.

Figure 4A:
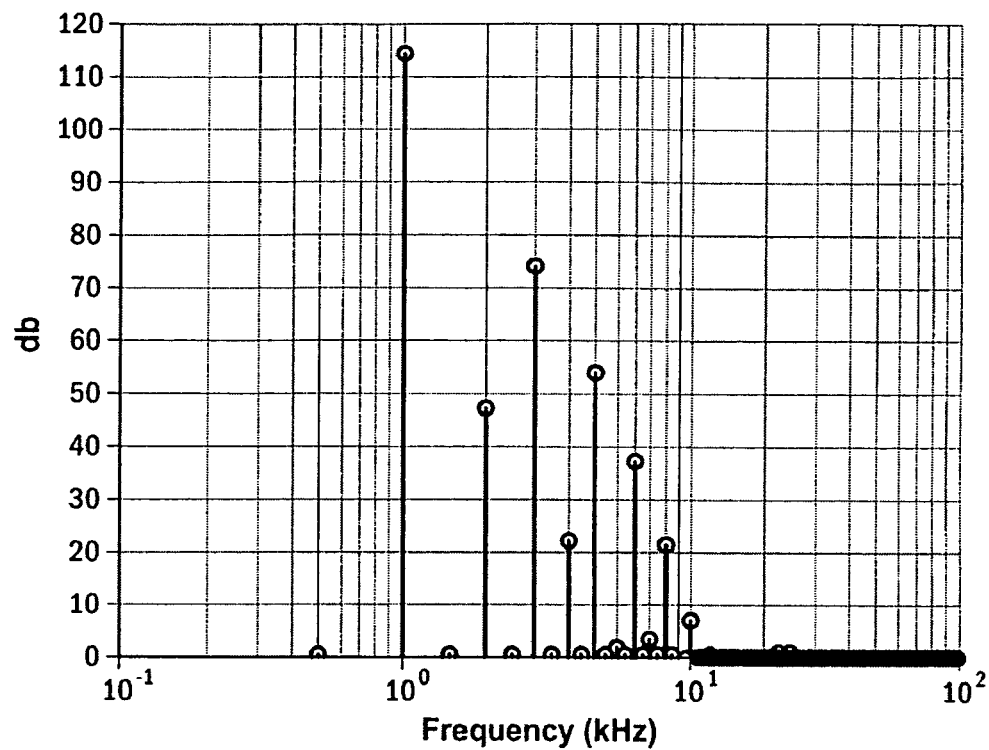
FIG. 4a is a spectrum plot of the output signal the amplifier 20 in the circuit of FIG. 1 with an input of 1 kHz.
Figure 4B:
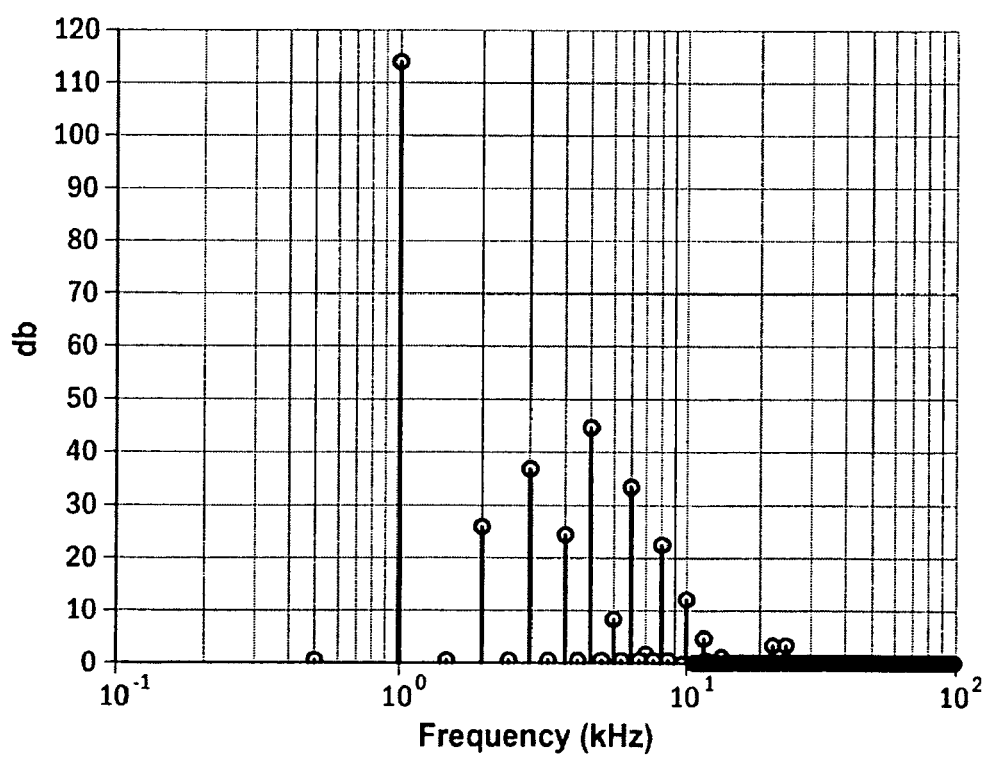
FIG. 4b is a spectrum plot of the output signal the amplifier 10 in the circuit of FIG. 1 with an input of 1 kHz.

FIG. 4a is a spectrum plot of the output signal the amplifier 20 in the circuit of FIG. 1 with an input of 1 kHz and FIG. 4b is a spectrum plot of the output signal the amplifier 10 in the circuit of FIG. 1 with an input of 1 kHz.

FIGS. 4a and 4b show more clearly the improvement in total harmonic distortion (THD). As shown in these figures, the THD+Noise from amplifier 20 is 0.9415% and that of amplifier 10 is 0.0367%. The numerical values will vary according to the input level set for the simulation.

Figure 5:
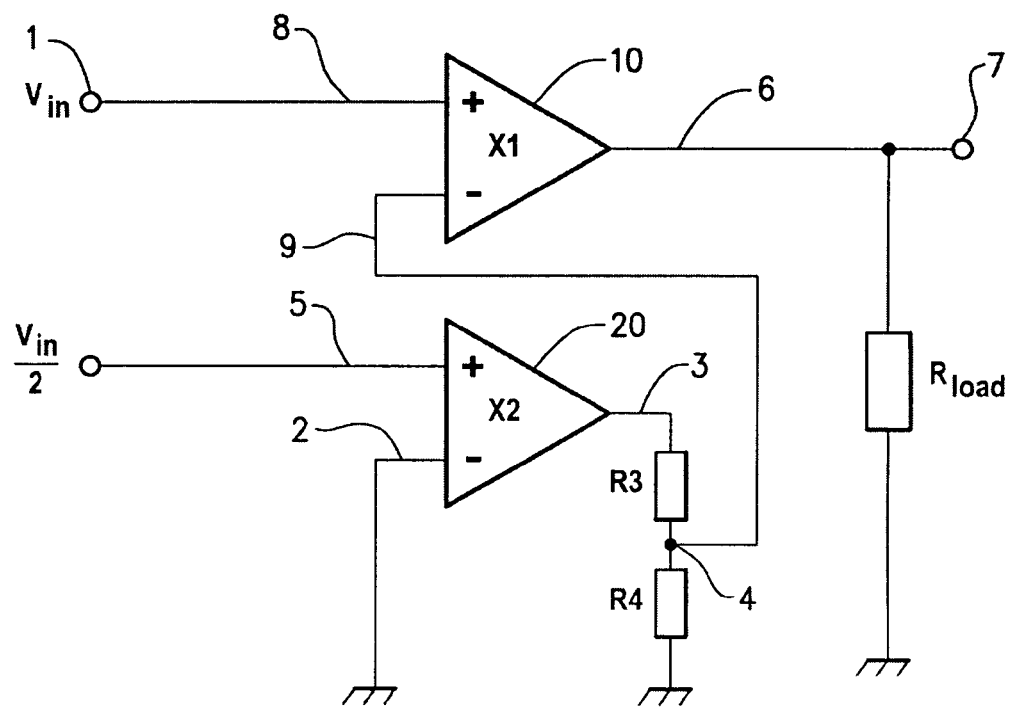
FIG. 5 is a schematic circuit diagram of an amplifier circuit according to a second embodiment of the invention.

FIG. 5 shows an amplifier circuit according to a second embodiment of the invention. The circuit comprises two identical amplifiers, a main amplifier (X1) 10 and a second amplifier (X2) 20. Both amplifiers have twice the gain $G_V$ required of the overall system. As the amplifiers are identical, they will have similar errors E generated during the amplification process. Ideally, the same operating conditions, such as the same supply voltage, same input voltage and same load impedance are applied to both amplifiers 10 and 20.

In the system of FIG. 5, the incoming signal $V_{in}$ is applied to a first point (point 1) and is then applied to the positive input of the main amplifier 10. The incoming signal is also applied, at half level, to the positive input of the second amplifier 20. The negative input of the second amplifier 20 is connected, at a point 2, to the system ground.

The output of the second amplifier 20 is connected, at a point 3, to the first end of a first resistor R3, the other end of the first resistor R3 being connected to a first end of a second resistor R4. The second end of the second resistor R4 is connected to system ground.

The junction of the first and second resistors R3 and R4, which is termed point 4, is connected to the negative input 9 of the main amplifier 10. The output of the main amplifier 10 is connected to one end of a load, which may be, for example, another amplifier such as a power amplifier in which case the load is a resistive element to ground, or another element such as a loud speaker. The other end of the load is connected to the system ground. The voltage across the load constitutes the output of the amplifier circuit.

The operation of the circuit of FIG. 5 is the same as that described above in connection with FIG. 1, the only difference being the removal from the circuit of FIG. 5 of the potential divider formed by R1 and R2 which is present in the circuit of FIG. 1. However, for the embodiment of FIG. 5 to work optimally, the input to amplifier 20 should be half the magnitude of the input to amplifier 10. In this embodiment, an input $V_{in}$ is applied to amplifier 10 and the same input but at half the magnitude, $V_{in}/2$, is applied to amplifier 20. These inputs may be from a source, such as a digital source with a Digital-to-Analogue converter being used to obtain the above configuration.

Figure 6:
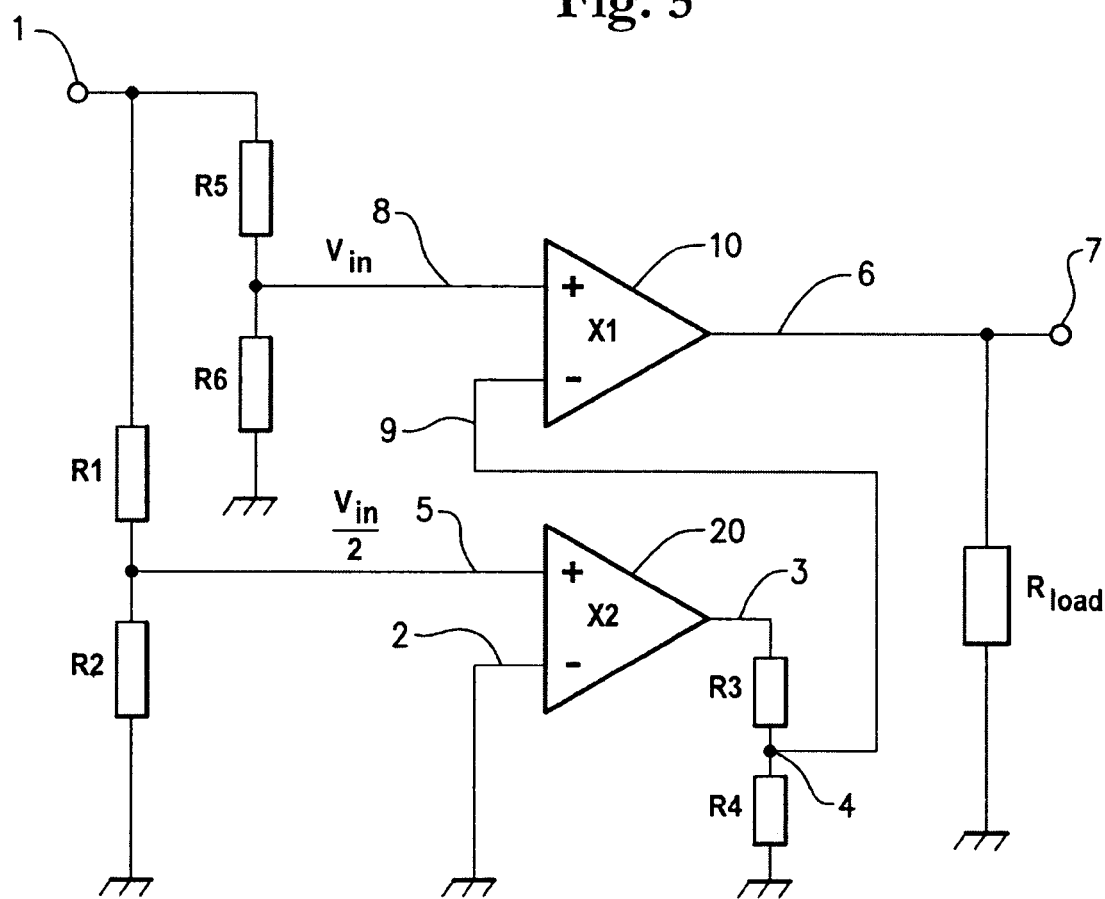
FIG. 6 is a schematic circuit diagram of an amplifier circuit according to a third embodiment of the invention.

FIG. 6 shows an amplifier circuit according to a third embodiment of the invention. The circuit comprises two identical amplifiers, a main amplifier (X1) 10 and a second amplifier (X2) 20. Both amplifiers have twice the gain $G_V$ required of the overall system. As the amplifiers are identical, they will have similar errors E generated during the amplification process. Ideally, the same operating conditions, such as the same supply voltage, same input voltage and same load impedance are applied to both amplifiers 10 and 20.

In the system of FIG. 6, the incoming signal is applied to a first point (point 1) and is then applied to a potential divider formed of two resistors R5 and R6. The junction (point 8) of the potential divider is connected to the positive input of the main amplifier 10. The end of resistor R6 which is not connected to resistor R5 is connected to the system ground. The input signal is applied to that end of resistor R5 which is not connected to resistor R6. The incoming signal is also applied to a first end of a further resistor R1, the other end of the resistor R1 being connected to a first end of another resistor R2. The other end of the resistor R2 is connected to the system ground. The junction (point 5) of the resistors R1 and R2 which form a potential divider is connected to the positive input of the second amplifier 20. The negative input of the second amplifier 20 is connected, at a point 2, to the system ground.

The values of R1, R2, R5 and R6 are selected such that the voltage applied to the positive input (point 5) of the amplifier 20 is half that applied to the positive input of the amplifier 10.

The output of the second amplifier 20 is connected, at a point 3, to the first end of a further resistor R3, the other end of the further resistor R3 being connected to a first end of another resistor R4. The second end of the resistor R4 is connected to system ground.

The junction of the resistors R3 and R4, which is termed point 4, is connected to the negative input 9 of the main amplifier 10. The output of the main amplifier 10 is connected to one end of a load, which may be, for example, another amplifier such as a power amplifier in which case the load is a resistive element to ground, or another element such as a loud speaker. The other end of the load is connected to the system ground. The voltage across the load constitutes the output of the amplifier circuit.

The operation of the circuit of FIG. 6 is essentially the same as that described above in connection with FIG. 1, the only difference being the addition in the circuit of FIG. 6 of a further potential divider formed by resistors R5 and R6 which is not present in the circuit of FIG. 1. In this embodiment, an input $V_{in}$ is applied to amplifier 10 and the same input but at half the magnitude, $V_{in}/2$, is applied to amplifier 20. As with the circuit of FIG. 5, these inputs may be from a source, such as a digital source with a Digital-to-Analogue converter being used to obtain the above configuration.

Figure 7:
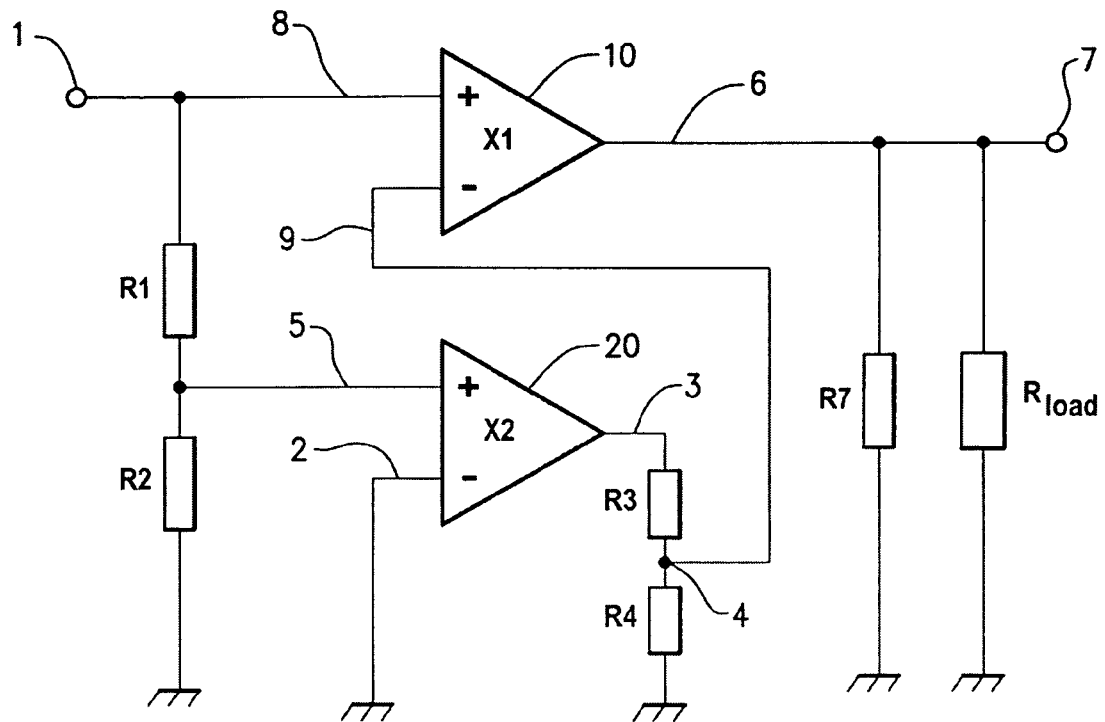
FIG. 7 is a schematic circuit diagram of an amplifier circuit according to a fourth embodiment of the invention.

FIG. 7 shows an amplifier circuit according to a fourth embodiment of the invention. The circuit comprises two identical amplifiers, a main amplifier (X1) 10 and a second amplifier (X2) 20. Both amplifiers have twice the gain $G_V$ required of the overall system. As the amplifiers are identical, they will have similar errors E generated during the amplification process. Ideally, the same operating conditions, such as the same supply voltage, same input voltage and same load impedance are applied to both amplifiers 10 and 20.

In the system of FIG. 7, the incoming signal $V_{in}$ is applied to a first point (point 1) and is then applied to the positive input of the main amplifier 10. The incoming signal is also applied to a first end of a first resistor R1, the other end of the first resistor R1 being connected to a first end of a second resistor R2. The other end of the second resistor R2 is connected to the system ground. The junction (point 5) of the first and second resistors R1 and R2 which form a potential divider is connected to the positive input of the second amplifier 20. The negative input of the second amplifier 20 is connected, at a point 2, to the system ground.

The output of the second amplifier 20 is connected, at a point 3, to the first end of a third resistor R3, the other end of the third resistor R3 being connected to a first end of a fourth resistor R4. The second end of the fourth resistor R4 is connected to system ground.

The junction of the third and fourth resistors R3 and R4, which is termed point 4, is connected to the negative input 9 of the main amplifier 10. The output of the main amplifier 10 is connected to one end of a load $R_{load}$, which may be, for example, another amplifier such as a power amplifier in which case the load $R_{load}$ is a resistive element to ground, or another element such as a loud speaker. The other end of the load $R_{load}$ is connected to the system ground. The voltage across the load $R_{load}$ constitutes the output of the amplifier circuit. A further resistor R7 is connected across the output of the amplifier 10 and the system ground, in parallel with the load $R_{load}$.

The loading on the amplifier 10 will depend on the load $R_{load}$ the user connects to the amplifier system and therefore the resistor R7 is included to reduce the variation in the overall load applied to the system. If, for example, the implementation is for a pre-amplifier, the load $R_{load}$ may be another amplifier, which may have a typical input impedance of between 10K ohms to 47K ohms. If the resistor R7, having a typical value of 1K ohms, is added in parallel with $R_{load}$, as shown in FIG. 7, the load of amplifier 10 is the effective resistance of resistor R7 in parallel with $R_{load}$ ($R7//R_{load}$). Thus, the range of load conditions will then be narrower, as:

$R7//R_{load}$=1 k//10 k=909 ohms, if the load has an input impedance of 10 k ohms and $R7//R_{load}$=1 k//47 k=979 ohms, if the load has an input impedance of 47 k ohms.

At the same time, the resistance value of resistors R3+R4 may be set between around 909 ohms and around 979 ohms so that the load conditions for the amplifier 10 and the amplifier 20 are close to each other.

Thus, the circuit of FIG. 7 is identical to that of FIG. 1 with the exception of the addition of the further resistor R7 to the circuit of FIG. 7. The operation of the circuit of FIG. 7 is essentially the same as that described above in connection with FIG. 1.

Figure 8:
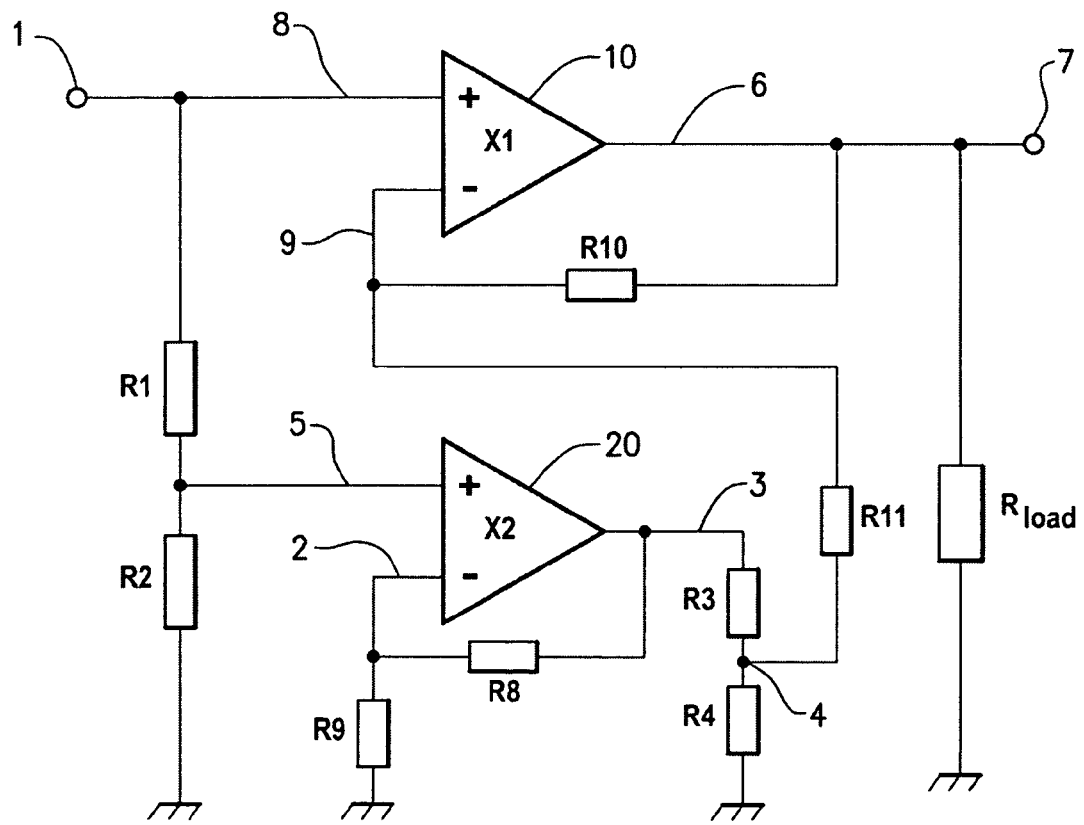
FIG. 8 is a schematic circuit diagram of an amplifier circuit according to a fifth embodiment of the invention.

FIG. 8 shows an amplifier circuit according to a fifth embodiment of the invention. The circuit comprises two identical amplifiers, a main amplifier (X1) 10 and a second amplifier (X2) 20. Both amplifiers have twice the gain $G_V$ required of the overall system. As the amplifiers are identical, they will have similar errors E generated during the amplification process. Ideally, the same operating conditions, such as the same supply voltage, same input voltage and same load impedance are applied to both amplifiers 10 and 20.

In the system of FIG. 8, the incoming signal $V_{in}$ is applied to a first point (point 1) and is then applied to the positive input of the main amplifier 10. The incoming signal is also applied to a first end of a first resistor R1, the other end of the first resistor R1 being connected to a first end of a second resistor R2. The other end of the second resistor R2 is connected to the system ground. The junction (point 5) of the first and second resistors R1 and R2 which form a potential divider is connected to the positive input of the second amplifier 20. The negative input of the second amplifier 20 is connected, at a point 2, to the junction of two further resistors R8 and R9. The other end of R9 which is not connected to R8 is taken to the system ground. The end of resistor R8 not connected to resistor R9 is connected to the output the amplifier 20, to control the gain of the amplifier 20 by applying feedback.

The output of the second amplifier 20 is connected, at a point 3, to the first end of a third resistor R3, the other end of the third resistor R3 being connected to a first end of a fourth resistor R4. The second end of the fourth resistor R4 is connected to system ground.

The junction of the third and fourth resistors R3 and R4, which is termed point 4, is connected to a further resistor R11, the other end of which is connected to the negative input 9 of the main amplifier 10. A further resistor R10 is connected between the negative input to the amplifier 10 and the output of the amplifier 10 at a point 6, to control the gain of the amplifier 10 by applying feedback. The values of the resistors R8, R9, R10 and R11 are preferably selected that the gains of the amplifiers 10 and 20 are substantially the same.

The output of the main amplifier 10 is connected to one end of a load, which may be, for example, another amplifier such as a power amplifier in which case the load is a resistive element to ground, or another element such as a loud speaker. The other end of the load is connected to the system ground. The voltage across the load constitutes the output of the amplifier circuit.

Thus, the circuit of FIG. 8 is identical to that of FIG. 1 with the exception of the addition of the further resistors R8 to R11 to the circuit of FIG. 7. The operation of the circuit of FIG. 7 is essentially the same as that described above in connection with FIG. 1, except that feedback is applied to both amplifiers 10 and 20 to control the gain of the amplifiers.

Thus, one or more embodiments of the invention may provide an amplifier system in which the bandwidth is significantly greater than that of conventional amplifiers with reduced phase shift and minimal distortion as the distorting errors generated by the individual amplifiers in the circuit are cancelled out.

The amplifiers 10 and 20 used in the simulation to obtain the figures quoted above did not have feedback applied internally. However, embodiments of the present invention may be applied to amplifiers with or without feedback.

Various modifications to the embodiments of the present invention described above may be made. For example, other components and method steps can be added or substituted for those above. Thus, although the invention has been described above using particular embodiments, many variations are possible within the scope of the claims, as will be clear to the skilled reader, without departing from the spirit and scope of the invention.

The invention claimed is:

1. An amplifier system comprising:
    a first amplifier arranged to receive an input signal;
    a second amplifier arranged to receive a second signal having a voltage level that is a proportion of said input signal, said second amplifier having an output signal; and
    a first potential divider arranged to receive said output signal of said second amplifier and to feed a proportion of said output signal to said first amplifier;
    wherein said first amplifier is arranged to subtract said proportion of said output signal of said second amplifier from said input signal to produce a difference signal amplifiable by said first amplifier and wherein said amplifier system has an overall gain, and said first and second amplifiers each have an associated gain, said gain associated with each of said first and second amplifiers being approximately twice the overall gain of said amplifier system.

2. An amplifier system according to claim 1, further comprising a second potential divider arranged to receive said input signal and feed said proportion of said input signal to said second amplifier.

3. An amplifier system according to claim 2, wherein said second potential divider comprises two substantially equal resistive components.

4. An amplifier system according to claim 3, wherein said resistive components are high precision components.

5. An amplifier system according to claim 1 wherein said first and second amplifiers are substantially identical.

6. An amplifier system according to claim 1, wherein said first potential divider comprises a first resistive component and a second resistive component, each of said first and second resistive components having an associated resistance, the ratio of said resistance associated with said first resistive component to said resistance associated with said second resistive component being such that the amplitude of said signal at a junction of said first and second resistive components is substantially equal to the amplitude of said input signal to said second amplifier divided by the gain of said second amplifier.

7. An amplifier system according to claim 6 wherein said first amplifier has an output, and wherein the sum of the associated resistances of said first and second resistive components of said first potential divider is substantially equal to a resistive load applied to said output of said first amplifier.

8. An amplifier system according to claim 1, wherein said proportion of said input signal received by said second amplifier is approximately 50%.

9. An amplifier system according to claim 1, wherein said first and said second amplifiers have substantially identical errors generated therein, said errors being substantially cancelled by the error generated in said second amplifier being subtracted from said error generated in said first amplifier.

10. An amplifier system according to claim 9, wherein said proportion of said input signal received by said second amplifier is approximately 50% of the input signal received by said first amplifier.

11. An amplifier system according to claim 1, further comprising a third potential divider arranged to receive said input signal and feed a proportion of said input signal to said first amplifier.

12. An amplifier system according to claim 1, wherein said first amplifier has an output, said system further comprising a resistive element connected between the output of said first amplifier and system ground, said resistive element being arranged to reduce variation in the loading of said first amplifier.

13. An amplifier system according to claim 1, wherein said first and second amplifiers each have a negative input and an output, said system further comprising a first resistive element connected between the negative input of the second amplifier and ground, and a second resistive element connected between the output of the second amplifier and the negative input of the second amplifier to set the gain of the second amplifier by feedback.

14. An amplifier system according to claim 13, further comprising a third resistive element connected between the negative input of the first amplifier and the junction of the resistors forming the first potential divider, and a fourth resistive element connected between the output of the first amplifier and the negative input of the first amplifier to set the gain of the first amplifier by feedback.

15. A method of amplifying a signal of an amplifier system, the method comprising:
applying an input signal to a first amplifier;
applying a second signal having a voltage level that is a proportion of said input signal to a second amplifier, said second amplifier having an output signal;
applying to a first potential divider said output signal of said second amplifier;
applying a proportion of said output signal to said first amplifier; and
subtracting in said first amplifier said proportion of said output signal of said second amplifier from said input signal to produce a difference signal amplifiable by said first amplifier, wherein said amplifier system has an overall gain, and said first and second amplifiers each have an associated gain, the method further comprising arranging said first and second amplifiers such that the gain associated with each of said first and second amplifiers is approximately twice the overall gain of said amplifier system.

16. A method according to claim 15, further comprising applying said input signal to a second potential divider, said proportion of said input signal applied to said second amplifier being applied by said second potential divider.

17. A method according to claim 16 wherein said first and second amplifiers are substantially identical, and said second potential divider comprises two substantially equal resistive components, said step of applying a proportion of said input signal to said second amplifier comprises applying approximately 50% of said input signal to said second amplifier.

18. A method according to claim 16, further comprising applying said input signal to a third potential divider, and applying a proportion of said input signal to said first amplifier through said third potential divider.

19. A method according to claim 16 wherein said proportion of said input signal received by said second amplifier is approximately 50% of said signal applied to said first amplifier through said third potential divider.

20. A method according to claim 16 further comprising reducing variation in the loading of said first amplifier using a resistive element connected between the output of said first amplifier and system ground.

21. A method according to claim 16 wherein said first and second amplifiers each have a negative input and an output, said method further comprising setting the gain of the second amplifier by feedback applied by connecting a first resistive element between the negative input of the second amplifier and ground, and a second resistive element between the output of the second amplifier and the negative input of the second amplifier.

22. A method according to claim 21 further comprising setting the gain of the first amplifier by feedback applied by connecting a third resistive element between the negative input of the first amplifier and the junction of the resistors forming the first potential divider, and a fourth resistive element between the output of the first amplifier and the negative input of the first amplifier.

23. A method according to claim 15 wherein said first potential divider comprises a first resistive component and a second resistive component, each of said first and second resistive components having an associated resistance, the method further comprising selecting said resistive components such that the ratio of said resistance associated with said first resistive component to said resistance associated with said second resistive component is such that the amplitude of said signal at a junction of said first and second resistive components is substantially equal to the amplitude of said input signal to said second amplifier divided by the gain of said second amplifier.

24. A method according to claim 15, wherein said first amplifier has an output, said method further comprising the step of applying a resistive load to said output of said first amplifier such that the sum of the associated resistances of said first and second resistive components of said first potential divider is substantially equal to said applied load.

25. A method according to claim 15 wherein said first and said second amplifiers have substantially identical errors generated therein, the method further comprising substantially cancelling said errors by subtracting said error generated in said second amplifier from said error generated in said first amplifier.

26. An amplifier system comprising:
a first amplifier arranged to receive an input signal;
a second amplifier arranged to receive a second signal having a voltage level that is a proportion of said input signal, said second amplifier having an output signal and
a first potential divider arranged to receive said output signal of said second amplifier and to feed a proportion of said output signal to said first amplifier; wherein said first amplifier is arranged to subtract said portion of said output signal of said second amplifier from said input signal to produce a difference signal amplifiable by said first amplifier, and wherein said first and second amplifiers are substantially identical and wherein the proportion of said output signal of said second amplifier fed to said first amplifier is substantially equal to the amplitude of said input signal to said second amplifier divided by the gain of said second amplifier.

27. An amplifier system according to claim 26 wherein the first amplifier and the second amplifier are operating under substantially the same differential voltage input conditions.

28. An amplifier system according to claim 26 wherein said system further comprises a resistive element connected between the output of said first amplifier and system ground, said resistive element connected between the output of said first amplifier and system ground, said resistive element being arranged to reduce the variation in the loading of said first amplifier.

* * * * *